(12) United States Patent
Hu

(10) Patent No.: US 11,146,217 B2
(45) Date of Patent: Oct. 12, 2021

(54) SIGNAL AMPLIFIER CIRCUIT HAVING HIGH POWER SUPPLY REJECTION RATIO AND DRIVING CIRCUIT THEREOF

(71) Applicant: Richtek Technology Corporation, Zhubei (TW)

(72) Inventor: Min-Hung Hu, New Taipei (TW)

(73) Assignee: RICHTEK TECHNOLOGY CORPORATION, Zhubei (TW)

(*) Notice: Subject to any disclaimer, the term of this patent is extended or adjusted under 35 U.S.C. 154(b) by 0 days.

(21) Appl. No.: 16/923,786

(22) Filed: Jul. 8, 2020

(65) Prior Publication Data

US 2021/0028747 A1  Jan. 28, 2021

(30) Foreign Application Priority Data

Jul. 24, 2019  (TW) .................. 108126207

(51) Int. Cl.
*H03F 3/45*  (2006.01)
*H03F 1/26*  (2006.01)

(52) U.S. Cl.
CPC .......... *H03F 1/26* (2013.01); *H03F 3/45475* (2013.01); *H03F 2200/372* (2013.01)

(58) Field of Classification Search
CPC ....................................................... H03F 3/45
USPC ........................ 330/260, 261, 310
See application file for complete search history.

(56) References Cited

U.S. PATENT DOCUMENTS

| 7,196,577 B2* | 3/2007 | Brunner ................ H03F 1/34 330/254 |
| 9,577,579 B2* | 2/2017 | Du .......................... H03F 3/211 |
| 2014/0285258 A1* | 9/2014 | Du .................... H03F 3/2171 330/10 |

OTHER PUBLICATIONS

"A CMOS LDO Regulator with High PSR Using Gain Boost-Up and Differential Feed Forward Noise Cancellation in 65nm Process" published on Proceedings of the ESSCIRC (ESSCIRC), IEEE, 2012.

* cited by examiner

*Primary Examiner* — Henry Choe
(74) *Attorney, Agent, or Firm* — Tung & Associates

(57) ABSTRACT

A signal amplifier circuit having high power supply rejection ratio includes: a pre-amplifier which generates a driving signal at a driving control node; and a driving circuit which converts an input power to an output power. The driving circuit includes: a driving transistor, having a first terminal coupled to the input power and a second terminal coupled to the output power; and a power rejection circuit which includes a noise selection circuit. When the driving transistor operates in its linear region, the power rejection circuit senses an AC component of a power noise of the input power to generate an operation noise signal. The power rejection circuit generates the power rejection signal in AC form according to the operation noise signal to reject the power noise so as to increase the power supply rejection ratio.

18 Claims, 13 Drawing Sheets

SIGNAL AMPLIFIER CIRCUIT HAVING HIGH POWER SUPPLY REJECTION RATIO AND DRIVING CIRCUIT THEREOF

CROSS REFERENCE

The present invention claims priority to TW 108126207 filed on Jul. 24, 2019.

BACKGROUND OF THE INVENTION

Field of Invention

The present invention relates to a signal amplifier circuit; particularly, it relates to such signal amplifier circuit having high power supply rejection ratio (PSRR). The present invention also relates to a driving circuit of such signal amplifier circuit.

Description of Related Art

Prior art relevant to the present invention is "A CMOS LDO Regulator with High PSR Using Gain Boost-Up and Differential Feed Forward Noise Cancellation in 65 nm Process" published on Proceedings of the ESSCIRC (ESSCIRC), IEEE, 2012.

Please refer to FIG. 1 and FIG. 2, which show schematic diagrams of a conventional linear dropout (LDO) circuit 1. The LDO circuit 1 includes a differential forward noise cancellation circuit 15 which generates a power rejection signal SPR according to a difference between a reference signal Vref and a noise input signal Sn. The generated power rejection signal SPR is inputted into a driver circuit 20. In this prior art, the driver circuit 20 adopts an output stage circuit which is implemented as a current mirror.

The prior art shown in FIG. 1 and FIG. 2 has following drawbacks that: first, because the differential forward noise cancellation circuit 15 includes an input stage circuit which has a common source structure, the bandwidth of the noise that the differential forward noise cancellation circuit 15 can reject is relatively low, but the circuit consumes more power. In addition, it is not easy to correctly determine the DC bias voltage at the input stage of the differential forward noise cancellation circuit 15. Second, because the driver circuit 20 adopts the output stage circuit which is implemented as a current mirror, the rising and falling of a driving signal of the driver circuit 20 will cause transient responses which are asymmetrical to each other. Third, the prior art shown in FIG. 1 and FIG. 2 will not be able to reject undesirable noises when the driving transistor operates in its linear region. Further, it is required for this prior art to rely on the equivalent series resistance (ESR) of an external output capacitor to maintain the loop stability.

As compared to the prior art in FIG. 1, the present invention is advantageous in that: first, the present invention has lower power consumption; second, the present invention has a better noise rejection bandwidth; third, when operating in the linear region, the present invention can effectively reject noises; and further, the present invention can perform an internal feed-forward compensation.

SUMMARY OF THE INVENTION

From one perspective, the present invention provides a signal amplifier circuit, comprising: a pre-amplifier circuit, which is configured to operably generate a driving signal at a driving control node; and a driver circuit, which is configured to operably convert an input power to an output power, wherein the driver circuit includes: a driving transistor having a first terminal coupled to the input power, a second terminal coupled to the output power, and a control terminal coupled to the driving signal, wherein a voltage difference between the first terminal of the driving transistor and the control terminal of the driving transistor determines a conduction level of the driving transistor, so as to convert the input power to the output power; and a power rejection circuit, which is configured to operably generate a power rejection signal at the driving control node according to the input power, to reject an AC component of a power noise of the input power so as to increase the power supply rejection ratio, wherein the power rejection signal has an AC component; wherein the power rejection circuit includes: a noise selection circuit, which is configured to operably detect and determine whether the driving transistor operates in a first operation region; wherein when the driving transistor operates in the first operation region, the noise selection circuit senses the AC component of the power noise of the input power according to a voltage difference between the first terminal and the second terminal, so as to generate an operation noise signal; wherein the power rejection circuit is configured to operably generate the power rejection signal at the driving control node according to the operation noise signal; wherein within the first operation region, an output resistance of the driving transistor is smaller than a predetermined resistance threshold.

In one embodiment, the power rejection circuit further includes at least one unilateral control circuit, wherein each unilateral control circuit has a corresponding input terminal and a corresponding output terminal; wherein the at least one unilateral control circuit includes a first unilateral control circuit, wherein an input terminal of the first unilateral control circuit is coupled to the noise selection circuit, and an output terminal of the first unilateral control circuit is coupled to the driving control node, wherein the first unilateral control circuit is configured to operably receive an AC component of the operation noise signal, to generate the power rejection signal at the driving control node; and wherein the first unilateral control circuit unilaterally injects the power rejection signal into the driving control node.

In one embodiment, the at least one unilateral control circuit further includes a second unilateral control circuit, wherein an input terminal of the second unilateral control circuit is electrically connected to the input power, and an output terminal of the second unilateral control circuit is coupled to the driving control node, wherein the second unilateral control circuit is configured to operably receive the AC component of the power noise, to generate the power rejection signal; and wherein the second unilateral control circuit unilaterally injects the power rejection signal into the driving control node.

In one embodiment, the pre-amplifier circuit includes a first gain stage circuit and a second gain stage circuit, wherein the second gain stage circuit is configured to operably generate the driving signal according to an output signal of the first gain stage circuit; and the at least one unilateral control circuit further includes a third unilateral control circuit, wherein an input terminal of the third unilateral control circuit is electrically connected to the output signal of the first gain stage circuit, and an output terminal of the third unilateral control circuit is coupled to the driving control node, wherein the third unilateral control circuit is configured to operably receive the AC component of the output signal of the first gain stage circuit, to generate a feed-forward compensation signal; and wherein the third unilateral control circuit unilaterally injects the feed-forward compensation signal into the driving control node, thereby performing signal compensation on the signal amplifier circuit.

In one embodiment, the noise selection circuit includes: a sensing transistor having a first terminal, a second terminal and a control terminal, wherein the sensing transistor is of a same type as the driving transistor, wherein the first terminal of the sensing transistor is coupled to the input power, and the control terminal of the sensing transistor is configured to operably receive the driving signal; a reference transistor having a first terminal, a second terminal and a control terminal, wherein the reference transistor is of a same type as the driving transistor, wherein the first terminal of the reference transistor is coupled to the input power, and the control terminal of the reference transistor is configured to operably receive the driving signal; a first current control circuit, which is configured to operably regulate a voltage of the second terminal of the sensing transistor according to a voltage of the second terminal of the driving transistor, such that the sensing transistor and the driving transistor concurrently operate in the first operation region or concurrently operate a second operation region, whereby a conduction current of the sensing transistor is positively proportional to a conduction current of the driving transistor; a second current control circuit, which is configured to operably regulate a voltage of the second terminal of the reference transistor according to a reference voltage, such that the reference transistor operates in the second operation region; wherein when the driving transistor operates in the second operation region, the output resistance of the driving transistor is equal to or greater than the predetermined resistance threshold; and a differential current amplifier circuit, which is configured to operably generate the operation noise signal according to a difference between the conduction current of the sensing transistor and the conduction current of the reference transistor.

In one embodiment, the driving transistor is a metal-oxide-semiconductor (MOS) transistor, wherein the first operation region corresponds to an linear region of the MOS transistor, while the second operation region corresponds to a saturation region of the MOS transistor.

In one embodiment, each unilateral control circuit includes: an input capacitor, wherein a first terminal of the input capacitor is coupled to the input terminal of the unilateral control circuit; an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage; and an output capacitor, wherein a first terminal of the output capacitor is coupled to the second terminal of the current amplification transistor, and a second terminal of the output capacitor is coupled to the output terminal of the unilateral control circuit.

In one embodiment, each unilateral control circuit includes: an input capacitor, wherein a first terminal of the input capacitor is coupled to the input terminal of the unilateral control circuit; an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage; and an output capacitor, wherein a first terminal of the output capacitor is coupled to the second terminal of the current amplification transistor, and a second terminal of the output capacitor is coupled to the output terminal of the unilateral control circuit; and wherein the first unilateral control circuit, the second unilateral control circuit and the third unilateral control circuit share the same output capacitor.

In one embodiment, the signal amplifier circuit further comprises: a buffer circuit coupled between the driving signal and the control terminal of the driving transistor, wherein the buffer circuit is configured to operably generate a buffer driving signal according to the driving signal, to control the driving transistor.

In one embodiment, the first current control circuit includes: a first mirror transistor which is connected as a diode; a second mirror transistor coupled to the first mirror transistor as a mirror current source, wherein the second mirror transistor is configured to operably mirror a conduction current of the first mirror transistor to generate a conduction current of the second mirror transistor, wherein a source of the first mirror transistor and a source of the second mirror transistor are coupled to the second terminal of the sensing transistor and the second terminal of the driving transistor, respectively; and a first amplification transistor coupled to the first mirror transistor and the second mirror transistor, wherein the first amplification transistor is configured to operably perform feedback amplification to generate a sensing current; wherein the second current control circuit includes: a third mirror transistor which is connected as a diode; a fourth mirror transistor coupled to the third mirror transistor as a mirror current source, wherein the fourth mirror transistor is configured to operably mirror a conduction current of the third mirror transistor to generate a conduction current of the fourth mirror transistor, wherein a source of the third mirror transistor and a source of the fourth mirror transistor are coupled to the second terminal of the reference transistor and the reference voltage, respectively; and a second amplification transistor coupled to the third mirror transistor and the fourth mirror transistor, wherein the second amplification transistor is configured to operably perform feedback amplification to generate a reference saturation current; wherein the differential current amplifier circuit is configured to operably generate the operation noise signal according to a difference between the sensing current and the reference saturation current.

From another perspective, the present invention provides a signal amplifier circuit, comprising: a pre-amplifier circuit, which is configured to operably generate a driving signal at a driving control node; and a driver circuit, which is configured to operably convert an input power to an output power, wherein the driver circuit includes: a driving transistor having a first terminal coupled to the input power, a second terminal coupled to the output power, and a control terminal coupled to the driving signal, wherein a voltage difference between the first terminal and the control terminal determines a conduction level of the driving transistor, so as to convert the input power to the output power; and a power rejection circuit, which is configured to operably generate a power rejection signal at the driving control node according to the input power, to reject an AC component of a power noise of the input power, so as to increase a power supply rejection ratio, wherein the power rejection signal has an AC component; wherein the power rejection circuit includes: an unilateral control circuit having an input terminal and an output terminal, wherein an input terminal of the unilateral control circuit is electrically connected to the input power, and an output terminal of the unilateral control circuit is coupled to the driving control node, wherein the unilateral control circuit is configured to operably receive the AC component of the power noise of the input power, to generate the power rejection signal; and wherein the unilateral control circuit unilaterally injects the power rejection signal into the driving control node.

From still another perspective, the present invention provides a driver circuit, which is configured to operably receive a driving signal at a driving control node, to convert an input power to an output power; the driver circuit comprising: a driving transistor having a first terminal coupled to the input power, a second terminal coupled to the output power, and a control terminal coupled to the driving signal, wherein a voltage difference between the first terminal of the driving transistor and the control terminal of the driving transistor determines a conduction level of the driving transistor, so as to convert the input power to the output power; and a power rejection circuit, which is configured to operably generate a power rejection signal at the driving control node according to the input power, to reject an AC component of a power noise of the input power, so as to increase a power supply rejection ratio, wherein the power rejection signal has an AC component; wherein the power rejection circuit includes: a noise selection circuit, which is configured to operably detect and determine whether the driving transistor operates in a first operation region; wherein when the driving transistor operates in the first operation region, the noise selection circuit senses the AC component according to a voltage difference between the first terminal and the second terminal, so as to generate an operation noise signal; wherein the power rejection circuit is configured to operably generate the power rejection signal at the driving control node according to the operation noise signal; wherein within the first operation region, an output resistance of the driving transistor is smaller than a predetermined resistance threshold.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
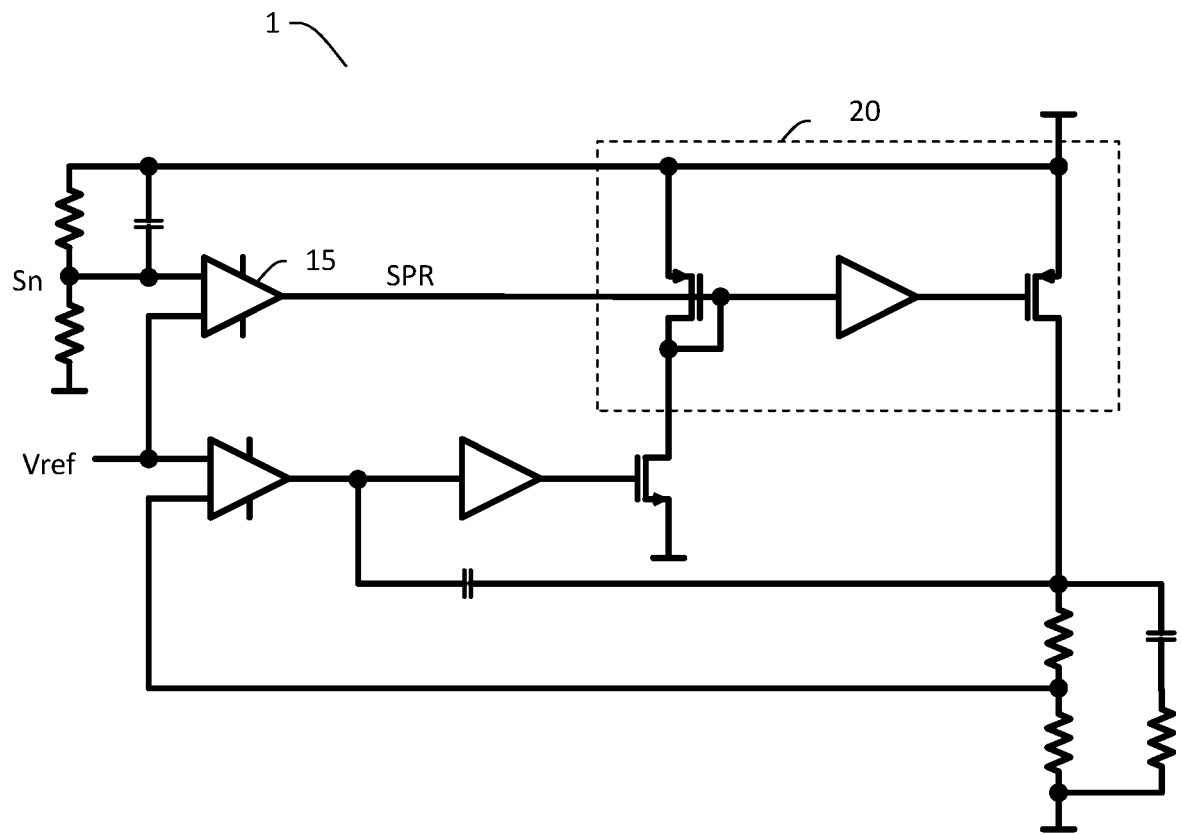
FIG. 1 shows a schematic diagram of a conventional LDO circuit.
Figure 2:
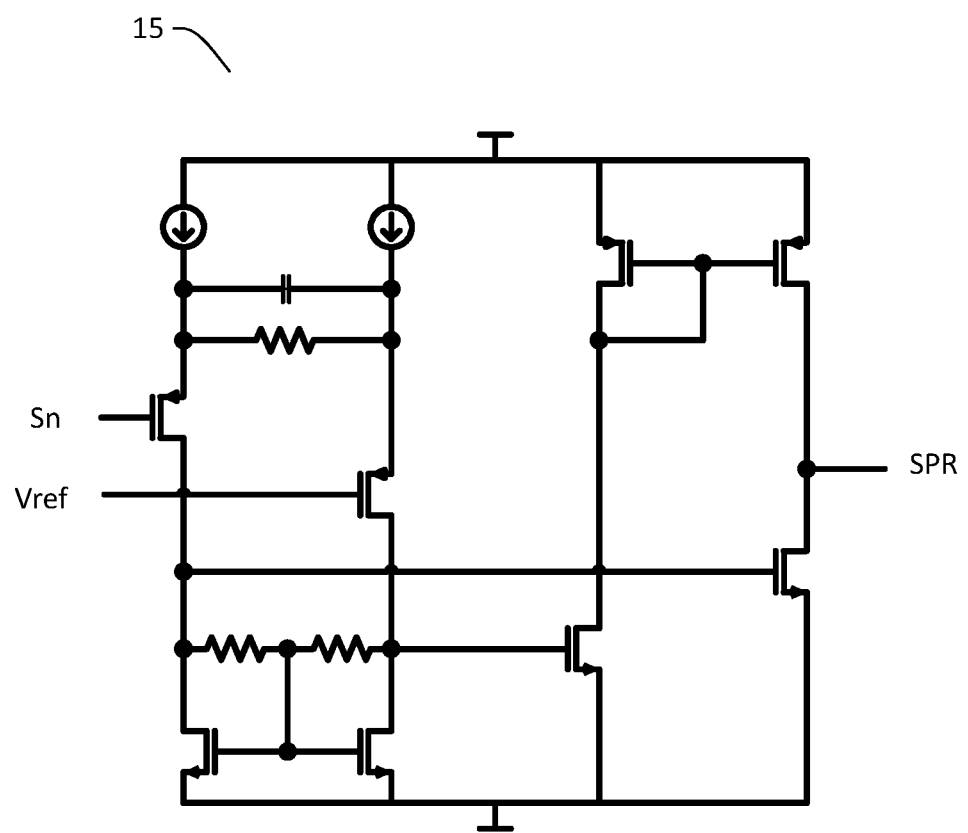
FIG. 2 shows a schematic diagram of a conventional amplifier circuit.
Figure 3A:
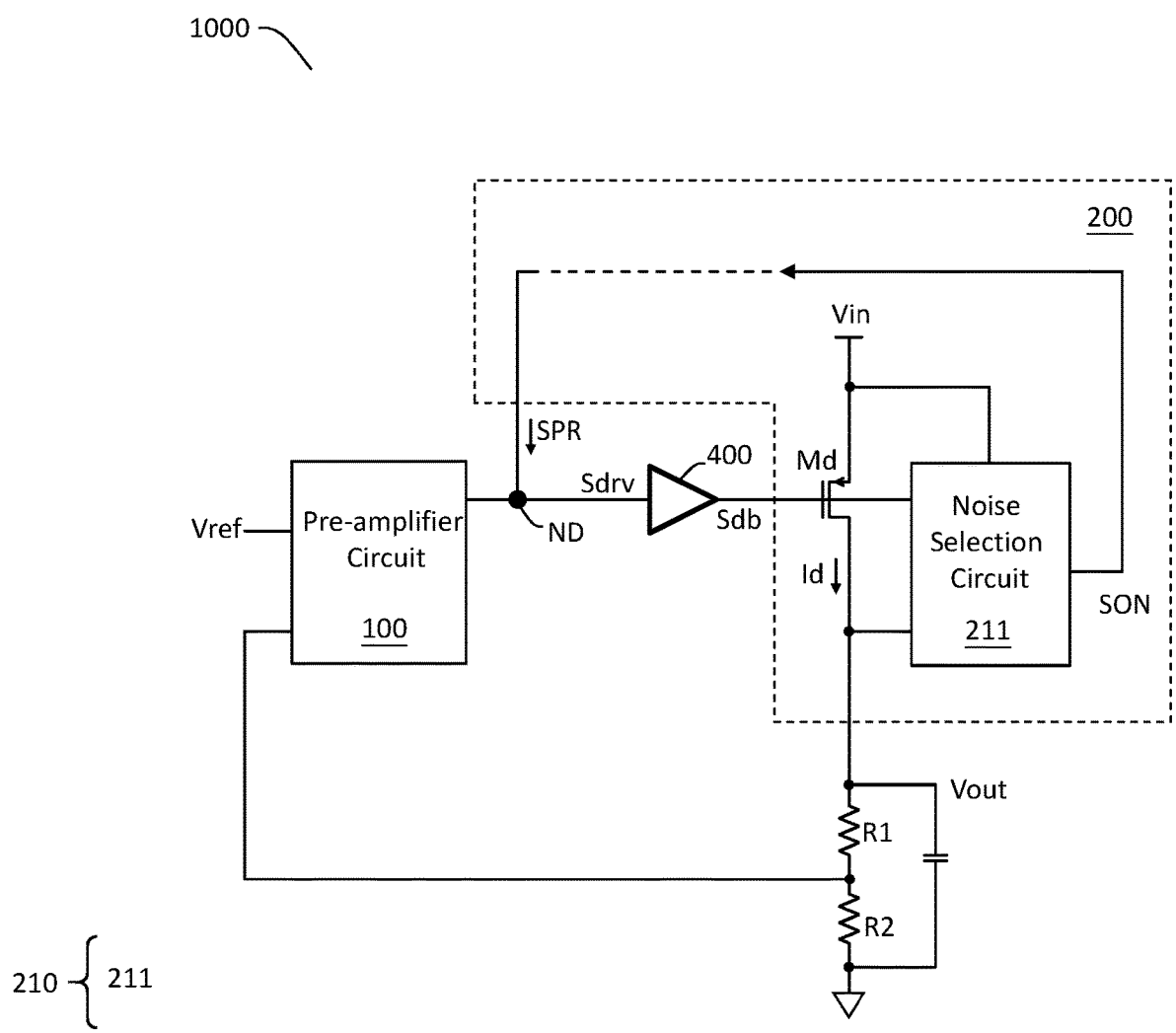
FIG. 3A shows a schematic block diagram of a signal amplifier circuit having high power supply rejection ratio according to an embodiment of the present invention.

Please refer to FIG. 3A, which shows a schematic block diagram of a signal amplifier circuit (i.e., signal amplifier circuit 1000) having high power supply rejection ratio (PSRR) according to an embodiment of the present invention. As shown in FIG. 3A, in this embodiment, the signal amplifier circuit 1000 comprises: a pre-amplifier circuit 100 and a driver circuit 200.

The pre-amplifier circuit 100 is configured to operably generate a driving signal Sdrv at a driving control node ND. The driver circuit 200 is coupled to the pre-amplifier circuit 100 and is configured to operably convert an input power Vin to an output power Vout.

In one embodiment, the driver circuit 200 can be applied in, for example but not limited to, a low drop-out regulator (LDO) having high PSRR; such LDO can correspond to, for example but not limited to, the signal amplifier circuit 1000 as shown in FIG. 3A. Moreover, in another embodiment, the driver circuit 200 can be applied in, for example but not limited to, an operational amplifier circuit having high PSRR. To be more specific, in the implementation where the signal amplifier circuit 1000 corresponds to the LDO shown in FIG. 3A, the pre-amplifier circuit 100 is configured to operably generate a driving signal Sdrv according to a difference between a reference signal Vref and an output power related signal (the output power related signal is for example a divided voltage of the output power Vout, and as shown in FIG. 3A, the divided voltage can be obtained through voltage divider resistors R1 and R2). In other words, in this embodiment, the pre-amplifier circuit 100 functions as an error amplifier circuit.

Please still refer to FIG. 3A. In this embodiment, the driver circuit 200 includes a driving transistor Md and a power rejection circuit 210. In one embodiment, the driving transistor Md can be, for example but not limited to, a metal-oxide-semiconductor (MOS) transistor. In one embodiment, preferably, the driving transistor Md can be, for example but not limited to, a PMOS transistor. However in other embodiments, it is also practicable and within the scope of the present invention that the driving transistor Md can be other types of transistor such as a BJT transistor.

Please still refer to FIG. 3A. The driving transistor Md has a first terminal (corresponding to the source of the driving transistor Md), a second terminal (corresponding to the drain of the driving transistor Md) and a control terminal (corresponding to the gate of the driving transistor Md). The source of the driving transistor Md is coupled to the input power Vin. The drain of the driving transistor Md is coupled to the output power Vout. The gate of the driving transistor Md is coupled to the driving signal Sdrv. Thus, the driving transistor Md can convert the input power Vin to the output power Vout. From one perspective, a voltage difference between the control terminal of the driving transistor Md and the first terminal of the driving transistor Md (corresponding to the gate-source voltage of the driving transistor Md) determines the conduction level of the driving transistor Md.

The power rejection circuit 210 is configured to operably generate a power rejection signal SPR at the driving control node ND according to the input power Vin and/or an operation region of the driving transistor Md, to reject a power noise of the input power Vin at the output power Vout, so as to increase a PSRR. In one embodiment, specifically, the power rejection circuit 210 is configured to operably reject an AC component of the power noise of the input power Vin, so as to increase the PSRR. In one embodiment, the power rejection signal SPR has an AC component. In one embodiment, the power rejection circuit 210 includes a noise selection circuit 211, wherein when the driving transistor Md operates in a first operation region, the noise selection circuit 211 is configured to operably sense the power noise of the input power Vin according to a voltage difference between the drain and the source (i.e., the first terminal and the second terminal) of the driving transistor Md, so as to generate an operation noise signal SON. As shown in FIG. 3A, the power rejection circuit 210 is configured to operably generate the power rejection signal SPR at the driving control node ND according to the operation noise signal SON. In the first operation region, the output resistance of the driving transistor Md is smaller than a predetermined resistance threshold. To be more specific, when the driving transistor Md is a MOS transistor, in one embodiment, the first operation region corresponds to its linear region. In other words, the noise selection circuit 211 included in the power rejection circuit 210 can effectively rejecting noises under a situation where the driving transistor Md is a MOS transistor operating in its linear region. The details of the noise selection circuit 211 will be described in detail later.

Generally, the above-mentioned power noise of the input power Vin may result from, for example, the switching noise of an upstream switching regulator which provides the input power Vin, and/or, the respective switching operations of all the loads coupled to the input power Vin. According to the present invention, in one embodiment, the power rejection circuit 210 is configured to operably reject in particular the AC component of the power noise of the input power Vin, so as to increase the PSRR.

Figure 3B:
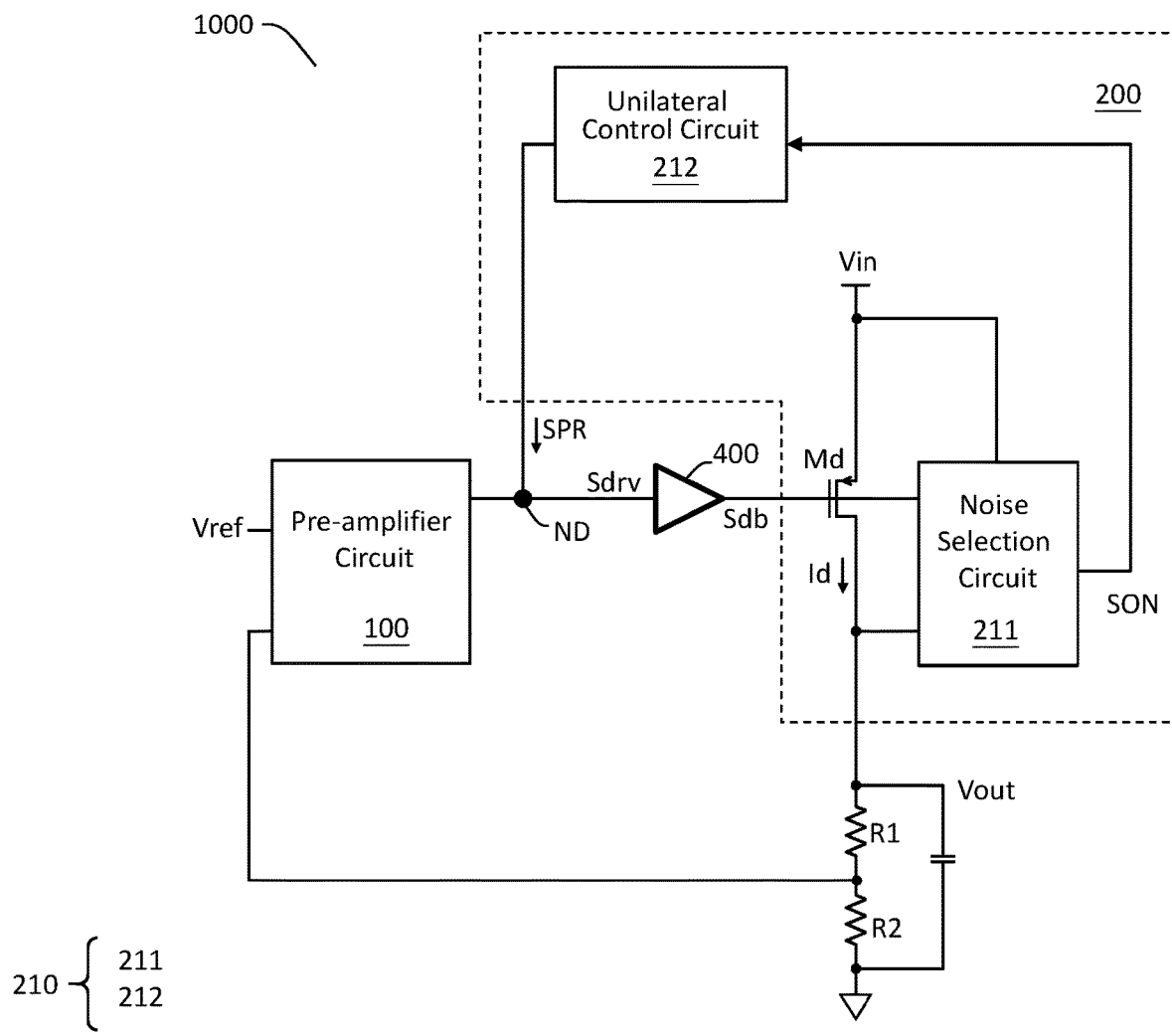
FIGS. 3B to 3E show schematic block diagrams of a signal amplifier circuit having high power supply rejection ratio according to several other embodiments of the present invention.

Several other embodiments of the signal amplifier circuit 1000 and the power rejection circuit 210 are shown below. Please refer to FIG. 3B, which shows a schematic block diagram of a signal amplifier circuit having high PSRR according to another embodiment of the present invention. As shown in FIG. 3B, in one embodiment, the power rejection circuit 210 can further include at least one unilateral control circuit. Each respective unilateral control circuit has a corresponding input terminal and a corresponding output terminal. As shown in FIG. 3B, in one embodiment, the at least one unilateral control circuit can include one unilateral control circuit 212. An input terminal of the unilateral control circuit 212 is coupled to the noise selection circuit 211, while an output terminal of the unilateral control circuit 212 is coupled to the driving control node ND. The unilateral control circuit 212 is configured to operably receive an AC component of the operation noise signal SON, and to generate the power rejection signal SPR at the driving control node ND accordingly. In addition, the unilateral control circuit 212 can unilaterally inject the power rejection signal SPR into the driving control node ND, to reject a power noise of the input power Vin at the output power Vout, so as to increase the PSRR. The features and the details of the unilateral control circuit will be described later.

It is noteworthy that, as one of average skill in the art will readily understand, the term "unilaterally" in the phrase of "the unilateral control circuit 212 can unilaterally inject the power rejection signal SPR into the driving control node ND", refers to that: the output signal of the output terminal of the unilateral control circuit is generated according to a signal received by the input terminal of the unilateral control circuit, but the output signal of the output terminal of the unilateral control circuit does not flow backward to affect the signal received by the input terminal of the unilateral control circuit. The term "unilaterally" used hereinafter in this specification is to be construed as above.

Figure 3C:
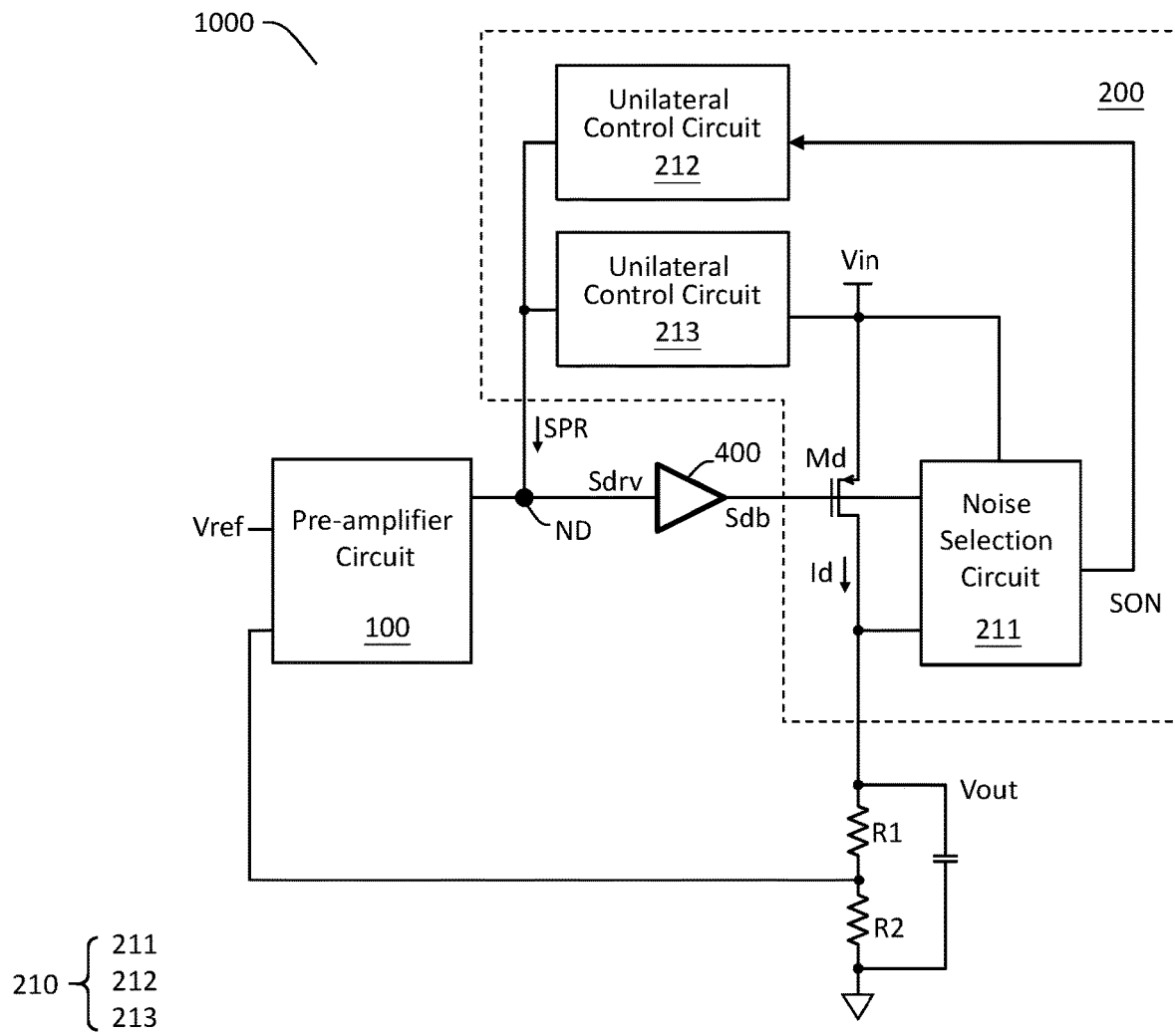

Please refer to FIG. 3C, which shows a schematic block diagram of a signal amplifier circuit having high PSRR according to yet another embodiment of the present invention. As shown in FIG. 3C, in one embodiment, the at least one unilateral control circuit can further include another unilateral control circuit 213. An input terminal of the unilateral control circuit 213 is electrically connected to the input power Vin, while an output terminal of the unilateral control circuit 213 is coupled to the driving control node ND. The unilateral control circuit 213 is configured to operably receive the AC component of the power noise, and to generate the power rejection signal SPR accordingly. In addition, the unilateral control circuit 213 can unilaterally inject the power rejection signal SPR into the driving control node ND, to reject a power noise of the input power Vin at the output power Vout, so as to increase the PSRR.

Figure 3D:
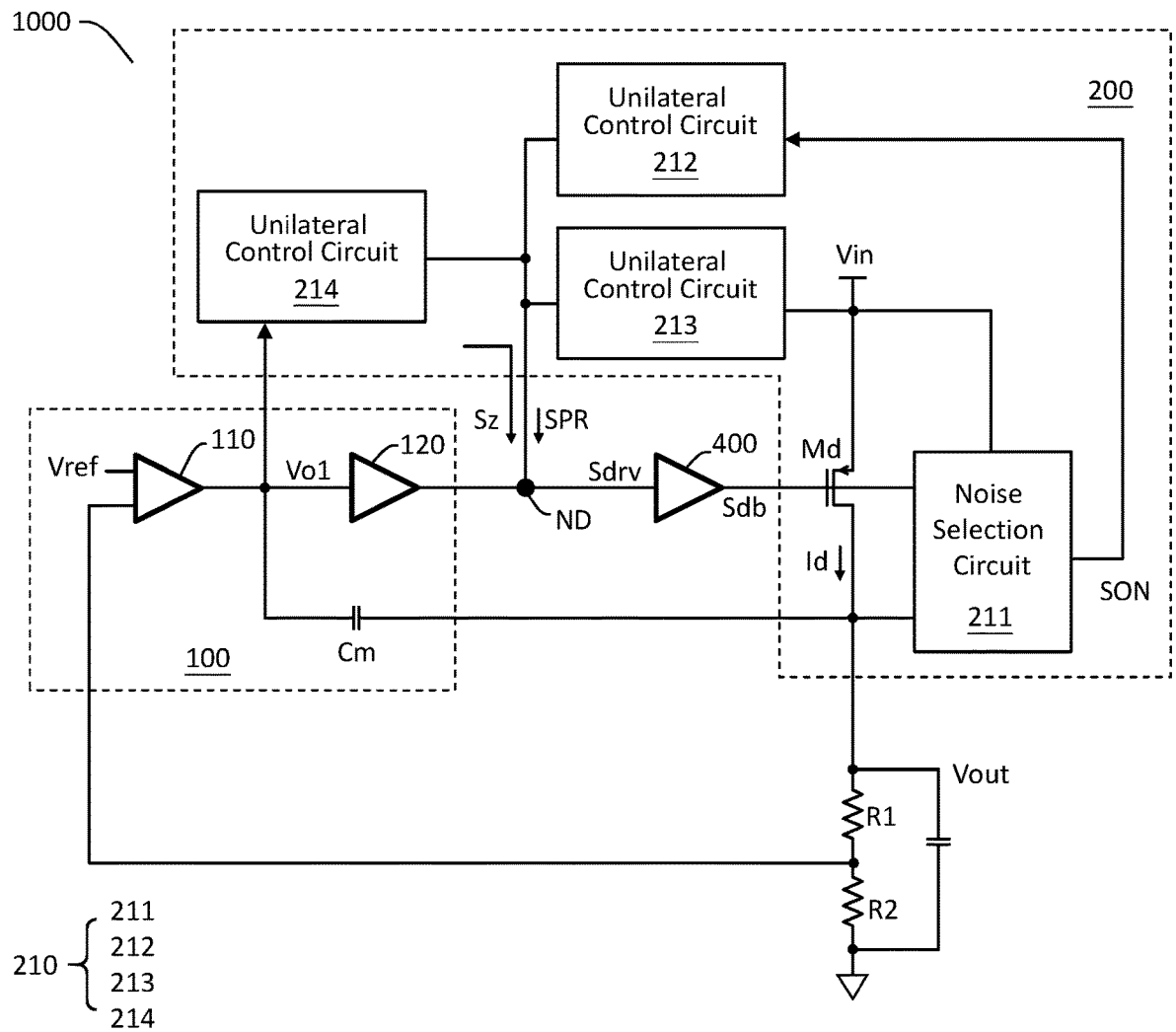

Please refer to FIG. 3D, which shows a schematic block diagram of a signal amplifier circuit having high PSRR according to yet another embodiment of the present invention. As shown in FIG. 3D, in one embodiment, the pre-amplifier circuit 100 includes a first gain stage circuit 110 and a second gain stage circuit 120. The second gain stage circuit 120 is configured to operably generate the driving signal Sdrv according to an output signal Vo1 of the first gain stage circuit 110. In one embodiment, the pre-amplifier circuit can include a feedback compensation capacitor Cm, which is configured to operably to perform loop compensation on the signal amplifier circuit 1000. In one embodiment, the feedback compensation capacitor Cm is coupled between the output signal Vo1 of the first gain stage circuit 110 and the output power Vout.

Please still refer to FIG. 3D. In this embodiment, the at least one unilateral control circuit further includes a unilateral control circuit 214. An input terminal of the unilateral control circuit 214 is electrically connected to the output signal Vo1 of the first gain stage circuit 110, while an output terminal of the unilateral control circuit 214 is coupled to the driving control node ND. From another perspective, the unilateral control circuit 214 and the second gain stage circuit 120 are coupled in parallel to each other. The unilateral control circuit 214 is configured to operably receive the AC component of the output signal Vo1 of the first gain stage circuit 110, and to generate a feed-forward compensation signal Sz accordingly. In addition, the unilateral control circuit 214 can unilaterally inject the feed-forward compensation signal Sz into the driving control node ND, to perform signal compensation on the signal amplifier circuit 1000. From one perspective, the feed-forward compensation signal Sz and the above-mentioned power rejection signal SPR are independent from each other. However, both the feed-forward compensation signal Sz and the above-mentioned power rejection signal SPR can be injected into the driving control node ND, to respectively provide the effects of compensation and noise rejection. In other words, each of the feed-forward compensation signal Sz and the power rejection signal SPR provides its own function independently.

Figure 3E:
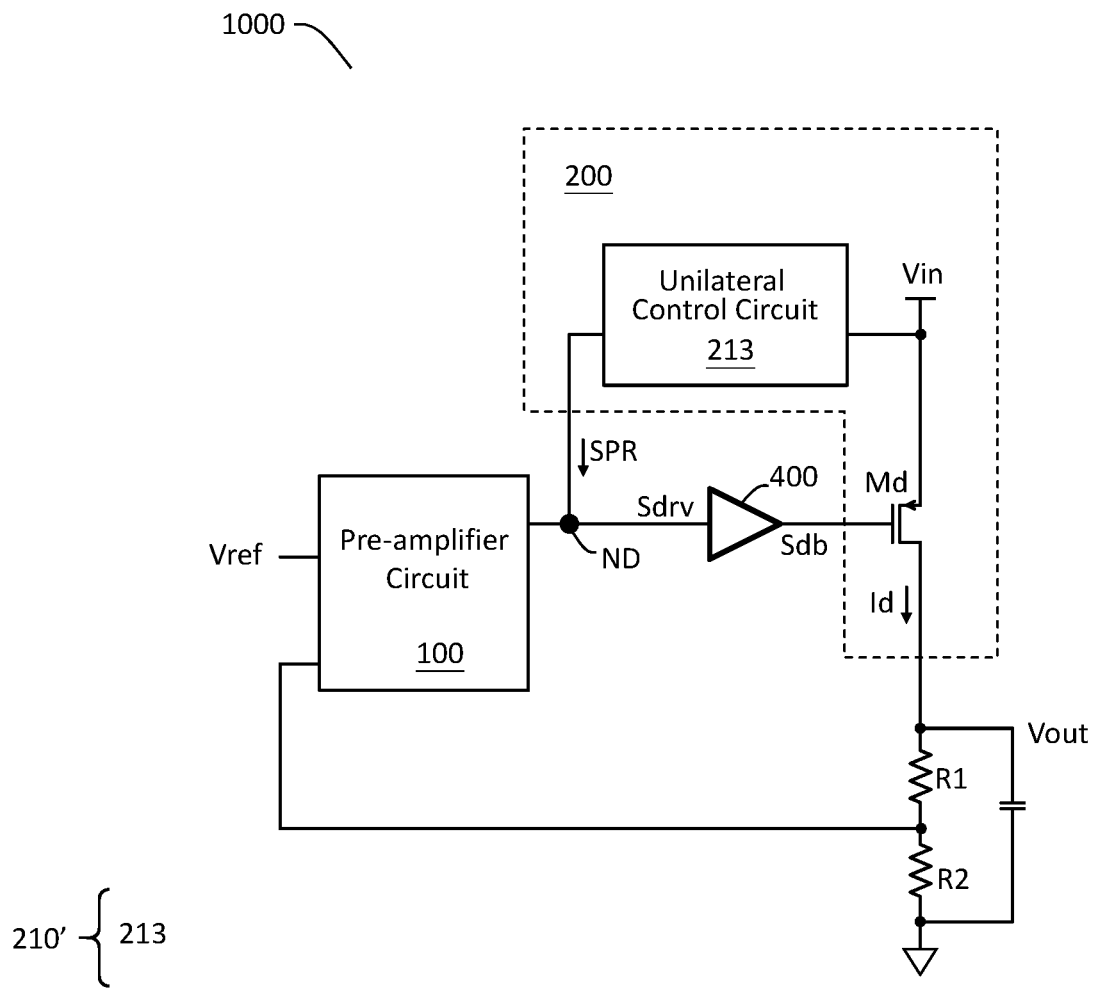

Please refer to FIG. 3E, which shows a schematic block diagram of a signal amplifier circuit having high PSRR according to yet another embodiment of the present invention. The embodiment of FIG. 3E is similar to the embodiment of FIG. 3D, but is different in that: as shown in FIG. 3E, the power rejection circuit 210' does not include the noise selection circuit 211 and the unilateral control circuit 212. To be more specific, in this embodiment, the power rejection circuit 210' includes a unilateral control circuit 213. In this embodiment, the unilateral control circuit 213 is configured to operably receive the AC component of the power noise, and to generate the power rejection signal SPR accordingly. In addition, the unilateral control circuit 213 can unilaterally inject the power rejection signal SPR into the driving control node ND, to reject a power noise of the input power Vin at the output power Vout, so as to increase the PSRR. From one perspective, the arrangement of the unilateral control circuit 213 in the power rejection circuit 210' is particularly suitable for rejecting the power noise when the driving transistor Md operates in a saturation region.

Figure 4:
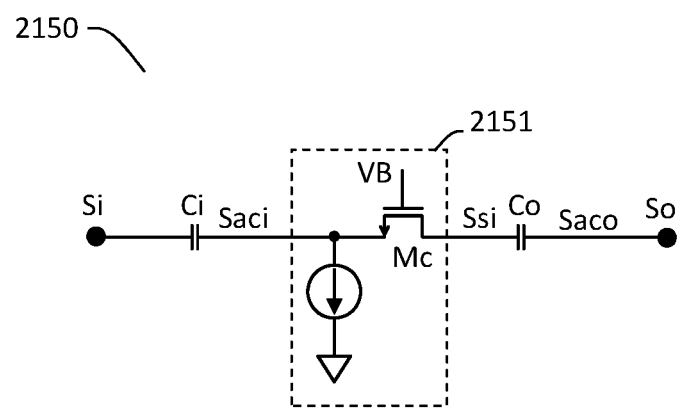
FIG. 4 shows a specific embodiment of a unilateral control circuit.

Please refer to FIG. 4, which shows a specific embodiment of a unilateral control circuit. As shown in FIG. 4, a unilateral control circuit 2150 (which can correspond to the unilateral control circuits 212, 213 or 214) has an input terminal Si and an output terminal So. The unilateral control circuit 2150 for example includes an input capacitor Ci, a unilateral current amplifier circuit 2151 and an output capacitor Co. A first terminal of the input capacitor Ci is coupled to the input terminal Si of the unilateral control circuit 2150. The input capacitor Ci is configured to operably couple an AC component of the signal receive from input terminal Si, to generate an AC input signal Saci. A first terminal of the current amplification transistor 2151 is coupled to a second terminal of the input capacitor Ci. The current amplification transistor 2151 can unilaterally receive the AC input signal Saci, to generate a unilateral signal Ssi. A first terminal of the output capacitor Co is coupled to a second terminal of the current amplification transistor 2151, while, a second terminal of the output capacitor Co is coupled to the output terminal So of the unilateral control circuit 2150. The output capacitor Co is configured to operably couple the unilateral signal Ssi, to generate a unilateral AC signal Saco.

As shown in FIG. 4, in a specific embodiment, the unilateral current amplifier circuit 2151 can include a current amplification transistor Mc. In one embodiment, the current amplification transistor Mc can be a MOS transistor. In one embodiment, preferably, the current amplification transistor Mc can be an NMOS transistor. The current amplification transistor Mc has a first terminal (corresponding to the source of the current amplification transistor Mc), a second terminal (corresponding to the drain of the current amplification transistor Mc) and a control terminal (corresponding to the gate of the current amplification transistor Mc). The source of the current amplification transistor Mc is coupled to a second terminal of the input capacitor Ci, while, the gate of the current amplification transistor Mc is coupled to a bias voltage VB. The first terminal of the output capacitor is coupled to the drain of the current amplification transistor Mc. From one perspective, the current amplification transistor Mc is implemented as a common gate amplifier circuit. To be more specific, the AC input signal Saci is inputted to the source of the current amplification transistor Mc. The current amplification transistor Mc can unilaterally conduct the AC input signal Saci to the drain of the current amplification transistor Mc, to generate the unilateral signal Ssi. From one perspective, a voltage difference between the control terminal of the current amplification transistor Mc and the first terminal of the current amplification transistor Mc (corresponding to the gate-source voltage of the current amplification transistor Mc) determines the conduction level of the current amplification transistor Mc. The current source as shown in FIG. 4 is configured to operably provide a DC bias current to the current amplification transistor Mc.

It should be understood that the implementation of the unilateral current amplifier circuit in the above-mentioned preferred embodiment is only an illustrative example, but not for limiting the scope of the present invention. In other embodiments, it is also practicable and within the scope of the present invention that the present invention can adopt for example a diode to achieve unilateral signal transmission.

Figure 5:
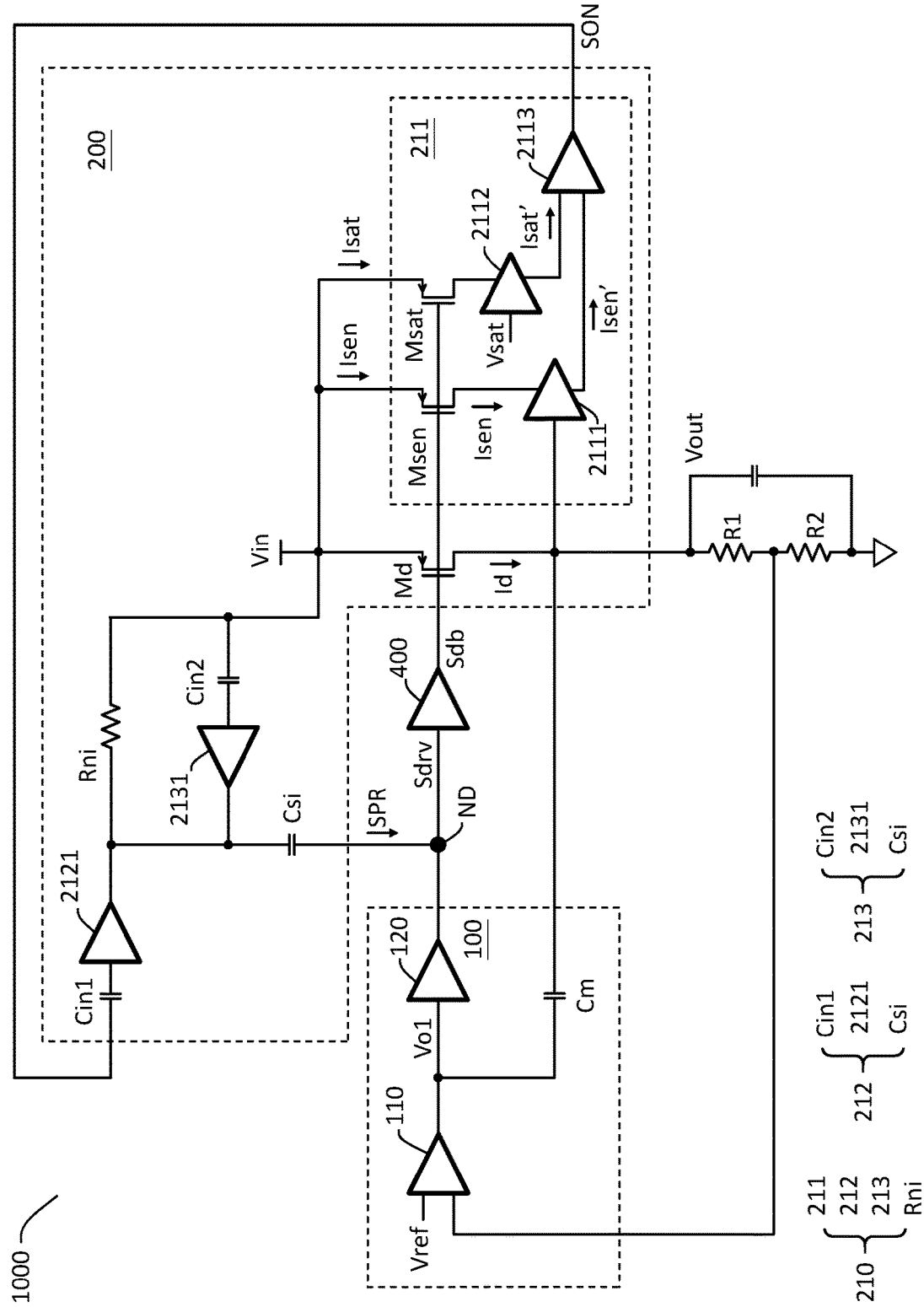
FIG. 5 shows a specific embodiment of a noise selection circuit and a unilateral control circuit.

Next, please refer to FIG. 5, which shows a specific embodiment of a noise selection circuit and a unilateral control circuit.

As shown in FIG. 5, in one embodiment, the noise selection circuit 211 can include a sensing transistor Msen, a reference transistor Msat, a first current control circuit 2111, a second current control circuit 2112 and a differential current amplifier circuit 2113.

In one embodiment, preferably, the sensing transistor Msen and the reference transistor Msat are of the same device type as the driving transistor Md. The source of the sensing transistor Msen is coupled to the input power Vin, whereas, the gate of the sensing transistor Msen is controlled by the driving signal Sdrv. In one embodiment, the source of the reference transistor Msat is coupled to the input power Vin, whereas, the gate of the reference transistor Msat is controlled by the driving signal Sdrv.

A first current control circuit 2111 is configured to operably regulate a drain voltage of the sensing transistor Msen according to a drain voltage of the driving transistor Md, such that the sensing transistor Msen and the driving transistor Md can operate both in the linear region or both in the saturation region (corresponding to a second operation region). To be more specific, the first current control circuit 2111 can regulate the drain voltage of the sensing transistor Msen, such that the drain voltage of the sensing transistor Msen is substantially equal to the drain voltage of the driving transistor Md, whereby the sensing transistor Msen and the driving transistor Md can concurrently operate in a same operation region. Consequently, under such circumstance, regardless whether the sensing transistor Msen and the driving transistor Md both operate in the linear region or both in the saturation region, the conduction current Isen of the sensing transistor Msen will be positively proportional to the conduction current Id of the driving transistor Md. Moreover, in this embodiment, the first current control circuit 2111 can further output a sense current Isen' which is proportional to the conduction current Isen of the sensing transistor Msen. In one embodiment, preferably, the ratio between the conduction current Isen and the sense current Isen' is 1:1.

Note that due to non-idealities caused by for example imperfection of components or imperfect matching among components, the drain voltage of the sensing transistor Msen may not be exactly equal to the drain voltage of the driving transistor Md, but just close to each other. In other words, according to the present invention, a certain level of error between the drain voltage of the sensing transistor Msen and the drain voltage of the driving transistor Md is acceptable, and therefore the term "substantially" is used to mean that an insignificant error within a tolerable range is acceptable. This is what is meant by the term "substantially" as it is used in the above phrase "the drain voltage of the sensing transistor Msen is substantially equal to the drain voltage of the driving transistor Md". It is noted here that when the term "substantially" is used in this specification, it means that an insignificant error within a tolerable range is acceptable.

The second current control circuit 2112 is configured to operably regulate a drain voltage of the reference transistor Msat according to a reference voltage Vsat, such that the reference transistor Msat operates in the saturation region. To be more specific, the second current control circuit 2112 can regulate the drain voltage of the reference transistor Msat, such that the drain voltage of the reference transistor Msat is substantially equal to the reference voltage Vsat, whereby the reference transistor Msat operates in the saturation region. It is noteworthy that, in contrast to a situation where the driving transistor Md operates in the linear region, when the driving transistor Md operates in the saturation region, the output resistance of the driving transistor Md is equal to or greater than the above-mentioned predetermined resistance threshold. Moreover, in this embodiment, the second current control circuit 2112 can further output a reference saturation current Isat' which is proportional to the conduction current Isat of the reference transistor Msat. In one embodiment, preferably, the ratio between the conduction current Isat and the reference saturation current Isat' is 1:1.

Please still refer to FIG. 5. The differential current amplifier circuit 2113 is configured to operably generate the operation noise signal SON according to a difference between the conduction current Isen of the sensing transistor Msen and the conduction current Isat of the reference transistor Msat. To be more specific, in this embodiment, the differential current amplifier circuit 2113 receives the sense current Isen' and the reference saturation current Isat', and generate the operation noise signal SON according to a difference between the sense current Isen' and the reference saturation current Isat' (which corresponds to a difference between the conduction current Isen and the conduction current Isat).

Please still refer to FIG. 5. In one embodiment, as described above, the unilateral control circuit 212 is configured to operably receive the AC component of the operation noise signal SON, to generate the power rejection signal SPR at the driving control node ND. In addition, the unilateral control circuit 212 can unilaterally inject the power rejection signal SPR into the driving control node ND. To be more specific, as shown in FIG. 5, in this embodiment, the unilateral control circuit 212 includes a capacitor Cin1, a capacitor Csi and a unilateral current amplifier circuit 2121. The capacitor Cin1 corresponds to the above-mentioned input capacitor Ci of the unilateral control circuit shown in FIG. 4. The capacitor Csi corresponds to the above-mentioned output capacitor Co shown in FIG. 4. The unilateral current amplifier circuit 2121 corresponds to the above-mentioned unilateral current amplifier circuit 2151 shown in FIG. 4.

Please still refer to FIG. 5. To be more specific, the noise selection circuit 211 is configured to operate so that, first, when the driving transistor Md operates in the linear region, the noise selection circuit 211 can generate the operation noise signal SON according to the power noise through sensing a difference between the conduction current Isen of the sensing transistor Msen (which operates in the linear region) and the conduction current Isat of the reference transistor Msat (which always operates in the linear region). And, the unilateral control circuit 212 is configured to operably receive the AC component of the operation noise signal SON, to generate the power rejection signal SPR at the driving control node ND. In addition, the unilateral control circuit 212 can unilaterally inject the power rejection signal SPR into the driving control node ND, to reject a power noise of the input power Vin at the output power Vout, so as to increase the PSRR. It is worthwhile mentioning that, the operation noise signal SON represents the power noise generated under a situation where the driving transistor Md operates in the linear region. That is, the noise selection circuit 211 and the unilateral control circuit 212 are provided and are effective in particular to reject the power noise for the situation where the driving transistor Md operates in the linear region.

Please still refer to FIG. 5. In one embodiment, as described above, the unilateral control circuit 213 is configured to operably receive the AC component of the power noise, to generate the power rejection signal SPR at the driving control node ND. In addition, the unilateral control circuit 213 can unilaterally inject the power rejection signal SPR into the driving control node ND. To be more specific, as shown in FIG. 5, in this embodiment, the unilateral control circuit 213 can include a capacitor Cin2, a capacitor Csi and a unilateral current amplifier circuit 2131. The capacitor Cin2 corresponds to the above-mentioned input capacitor Ci of the unilateral control circuit shown in FIG. 4. The capacitor Csi corresponds to the above-mentioned output capacitor Co. The unilateral current amplifier circuit 2131 corresponds to the above-mentioned unilateral current amplifier circuit 2151.

Note that, in one embodiment, as shown in FIG. 5, the unilateral control circuit 212 and the unilateral control circuit 213 share (i.e. commonly use) the same output capacitor (which corresponds to the above-mentioned capacitor Csi).

Figure 6:
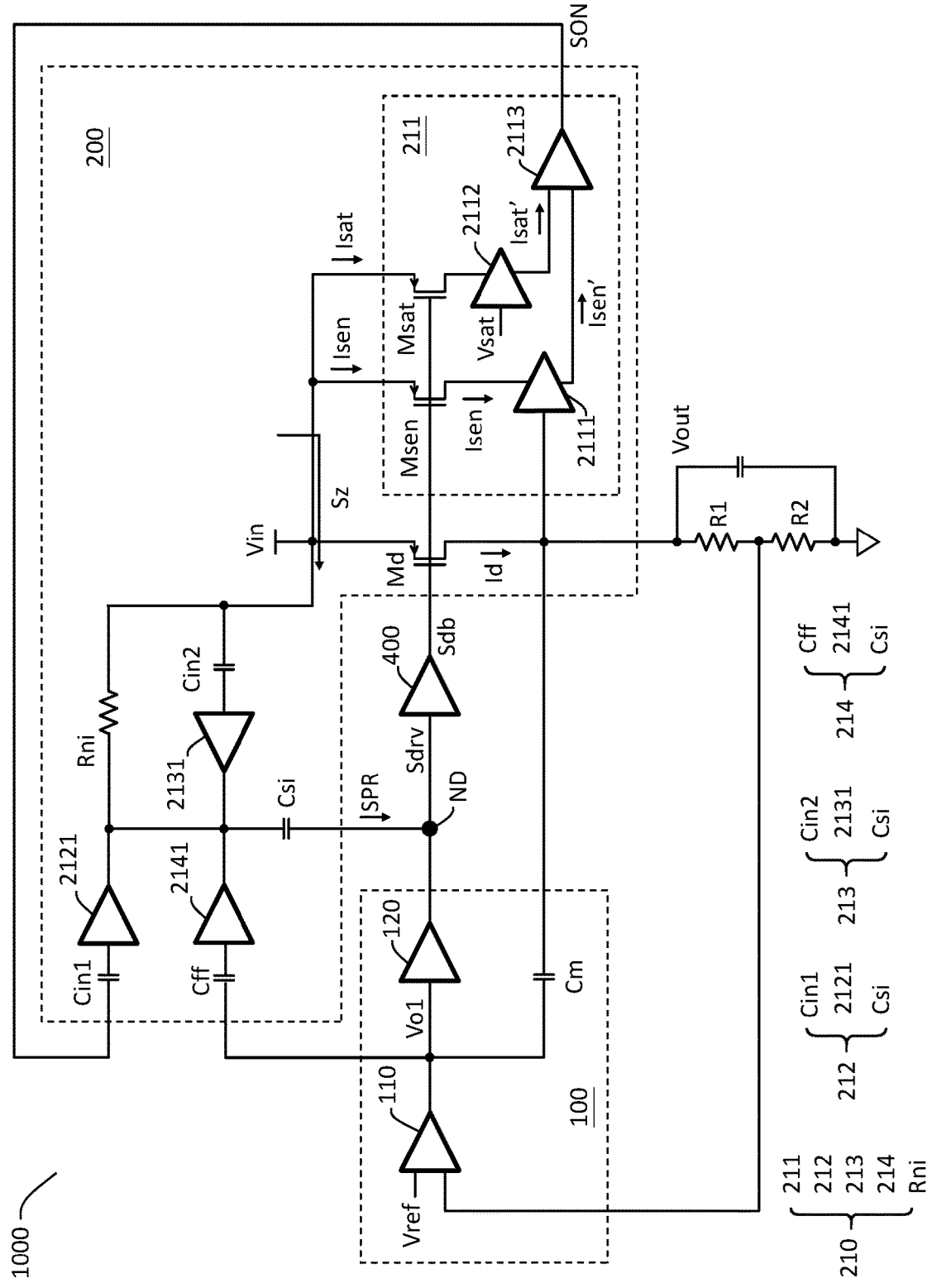
FIG. 6 shows a specific embodiment of a noise selection circuit, a unilateral control circuit and a pre-amplifier circuit.

Next, please refer to FIG. 6, which shows a specific embodiment of a noise selection circuit, a unilateral control circuit and a pre-amplifier circuit.

Please refer to FIG. 6. In this embodiment, the power rejection circuit 210 can further include a unilateral control circuit 214. To be more specific, as shown in FIG. 6, in this embodiment, the unilateral control circuit 214 includes a capacitor Cff, a capacitor Csi and a unilateral current amplifier circuit 2141. The capacitor Cff corresponds to the above-mentioned input capacitor Ci of the unilateral control circuit shown in FIG. 4. The capacitor Csi corresponds to the above-mentioned output capacitor Co. The unilateral current amplifier circuit 2141 corresponds to the above-mentioned unilateral current amplifier circuit 2151. Note that in the embodiment shown in FIG. 6, the unilateral control circuit 212, the unilateral control circuit 213 and the unilateral control circuit 214 share the same output capacitor (which corresponds to the above-mentioned capacitor Csi)

Please still refer to FIG. 6. The input terminal (the terminal connected to the capacitor Cff) of the unilateral control circuit 214 is electrically connected to the output signal Vo1 of the first gain stage circuit 110, while the output terminal (the terminal connected to the capacitor Csi) of the unilateral control circuit 214 is coupled to the driving control node ND. The unilateral control circuit 214 is configured to operably receive the AC component of the output signal Vo1 of the first gain stage circuit 110, to generate a feed-forward compensation signal Sz. The unilateral control circuit 214 unilaterally injects the feed-forward compensation signal Sz into the driving control node ND, to perform signal compensation on the signal amplifier circuit 100.

Please still refer to FIG. 5 and FIG. 6. In one embodiment, the signal amplifier circuit 100 further comprises a buffer circuit 400. The buffer circuit 400 is coupled between the driving signal Sdrv and the control terminal of the driving transistor Md. The buffer circuit 400 is configured to operably generate a buffer driving signal Sdb according to the driving signal Sdrv, to control the driving transistor Md. In one embodiment, the buffer circuit 400 can be omitted from the signal amplifier circuit 100. Under such circumstance (i.e. the buffer circuit 400 is omitted), the driving signal Sdrv can directly control the driving transistor Md through, for example, electrically connecting the driving signal Sdrv to the buffer driving signal Sdb.

Please still refer to FIG. 5 and FIG. 6. In one embodiment, the power rejection circuit 210 further includes a bias resistor Rni. The bias resistor Rni is coupled between the input power Vin and the other terminal of the common output capacitor Csi. The bias resistor Rni is configured to operably generate a DC level of the above-mentioned unilateral control circuits.

Figure 7:
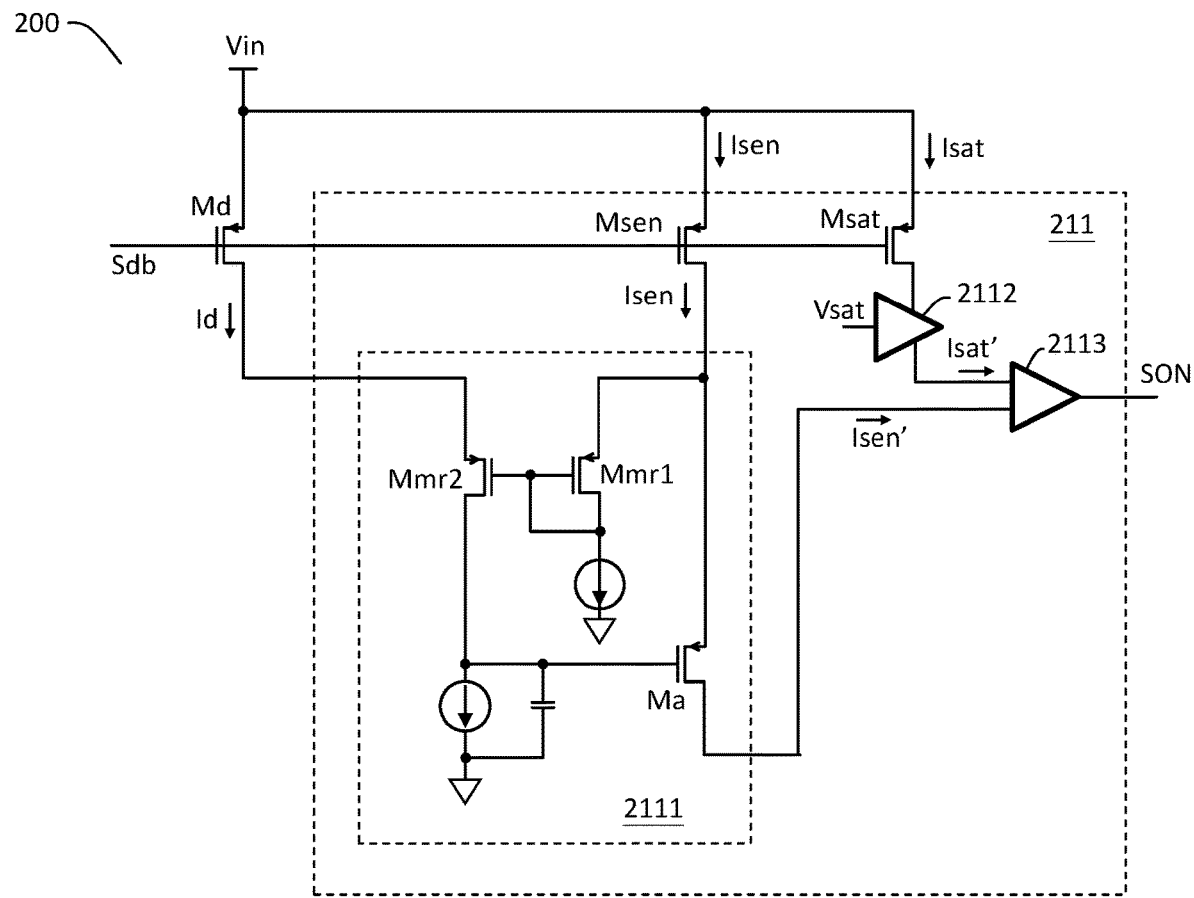
FIG. 7 shows a specific embodiment of a noise selection circuit and a current control circuit therein.

Please refer to FIG. 7, which shows a specific embodiment of a noise selection circuit and a current control circuit therein.

As shown in FIG. 7, in one embodiment, the first current control circuit 2111 can include: a first mirror transistor Mmr1, a second mirror transistor Mmr2 and an amplification transistor Ma. The first mirror transistor Mmr1 is connected as a diode. That is, the gate of the first mirror transistor Mmr1 and the drain of the first mirror transistor Mmr1 are electrically connected to each other. The second mirror transistor Mmr2 is coupled to the first mirror transistor Mmr1 as a mirror current source. That is, the gate of the second mirror transistor Mmr2 and the gate of the first mirror transistor Mmr1 are electrically connected to each other, whereby the second mirror transistor Mmr2 mirrors the conduction current of the first mirror transistor Mmr1 to generate a conduction current of the second mirror transistor Mmr2. The source of the first mirror transistor Mmr1 and the source of the second mirror transistor Mmr2 are coupled to the drain of the sensing transistor Msen and the drain of the driving transistor Md, respectively. In this embodiment, the amplification transistor Ma is coupled to the first mirror transistor Mmr1 and the second mirror transistor Mmr2, for feedback amplification to generate the sensing current Isen'. To be more specific, the source of the amplification transistor Ma is coupled to the source of the first mirror transistor Mmr1; the gate of the amplification transistor Ma is coupled to the drain of the second mirror transistor Mmr2; the drain of the amplification transistor Ma outputs the sensing current Isen'. In one embodiment, all of the first mirror transistor Mmr1, the second mirror transistor Mmr2 and the amplification transistor Ma are MOS transistors.

The second current control circuit 2112 can be implemented in the same way as the first current control circuit 2111, so the details thereof are not redundantly repeated here.

Figure 8:
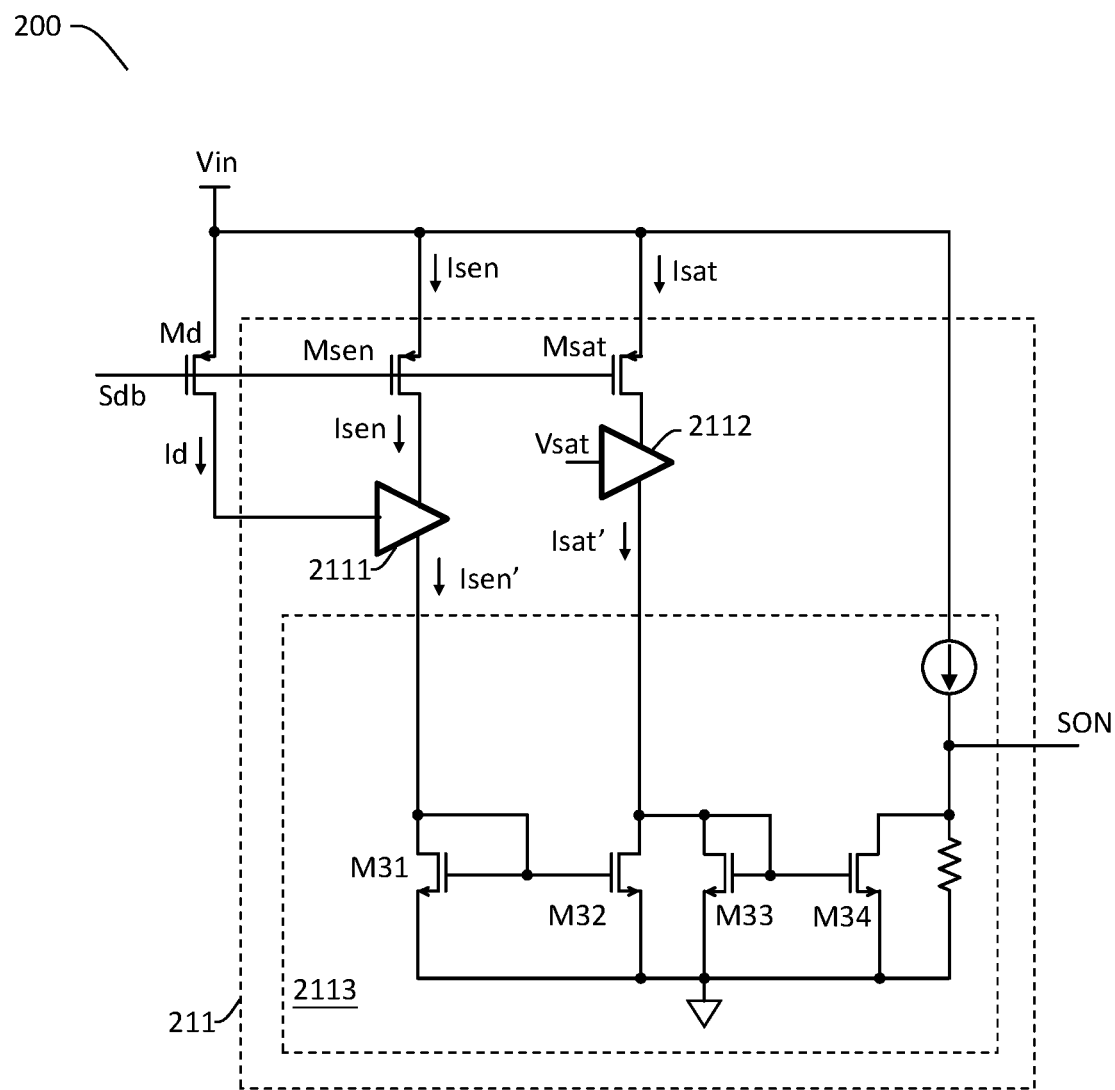
FIG. 8 shows a specific embodiment of a differential current amplifier circuit.

Please refer to FIG. 8, which shows a specific embodiment of a differential current amplifier circuit. In this embodiment, the differential current amplifier circuit 2113 can include current amplification transistors M31, M32, M33 and M34. The current amplification transistors M31 and M32 are implemented as a current comparison circuit and are configured to operably compare the sense current Isen' with the reference saturation current Isat', so as to generate the operation noise signal SON. The current amplification transistors M33 and M34, and the current source and the resistor shown in FIG. 8 are implemented as shown to adjust the current level and DC bias level.

Figure 9:
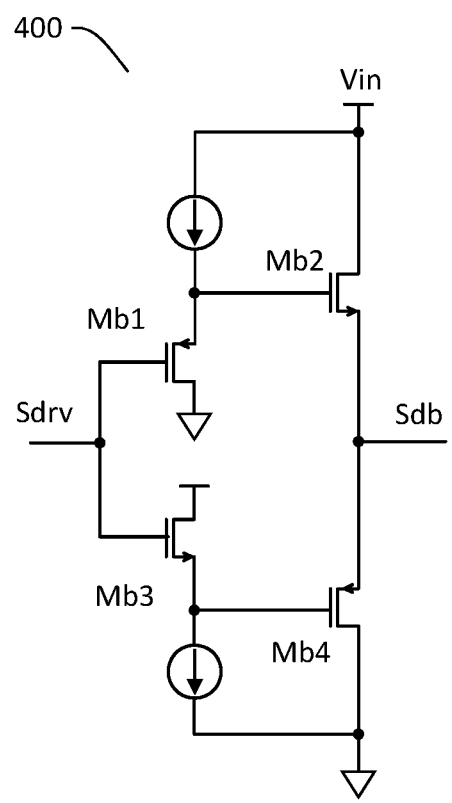
FIG. 9 shows a specific embodiment of a buffer circuit.

Please refer to FIG. 9, which shows a specific embodiment of a buffer circuit. In this embodiment, the buffer circuit 400 can include four bias transistors Mb1, Mb2, Mb3 and Mb4. The bias transistors Mb1 and Mb2 biases the driving signal Sdrv from one end while the bias transistors Mb3 and Mb4 biases the driving signal Sdrv from another end, to generate the buffer driving signal Sdb, so that a voltage of the buffer driving signal Sdb is substantially equal to a voltage of the driving signal Sdrv. From one perspective, the buffer circuit 400 can be regarded as a one-fold voltage buffer circuit, for eliminate the loading effect on the driving signal Sdrv.

According to the present invention, the noise selection circuit 211 and the unilateral control circuit 212 can effectively reject the power noise of the input power Vin when the driving transistor Md operates in the linear region, so as to increase the PSRR. In addition, the unilateral control circuit 212 can effectively reject the power noise of the input power Vin when the driving transistor Md operates in the saturation region, so as to increase the PSRR.

It is worthwhile mentioning that, in the embodiments shown in FIG. 3A, FIG. 5, FIG. 7 and FIG. 8, the noise selection circuit 211 functions to detect and determine which operation region the driving transistor Md is operating in. For example, the noise selection circuit 211 can detect and determine whether the driving transistor Md is operating in the linear region, or to detect and determine whether the driving transistor Md is operating in the saturation region, so that at different operation regions, the operation noise signal SON can be adaptively adjusted to generate a proper power rejection signal to better reject the power noise of the input power Vin, so as to increase the PSRR. In more detail, in one embodiment, when the noise selection circuit 211 detects and determines that the driving transistor Md is operating in the linear region, the noise selection circuit 211 will accordingly raise up the operation noise signal SON, whereas, when the noise selection circuit 211 detects and determines that the driving transistor Md is operating in the saturation region, the noise selection circuit 211 will gradually lower down the operation noise signal SON until the operation noise signal SON eventually becomes OFF.

Note that, the linear region and the saturation region of a MOS transistor do not have a clear boundary in between; basically, a MOS transistor operates and transits continuously in these two regions. Therefore preferably, in the embodiments shown in FIG. 3A, FIG. 5, FIG. 7 and FIG. 8, the noise selection circuit 211 detects and determines which operation region the driving transistor Md is operating in, and adjust the power rejection signal SPR (through adjusting the operation noise signal SON), in a continuous, analog way. In more detail, in the noise selection circuit 211, the first current control circuit 2111, the second current control circuit 2112 and the differential current amplifier circuit 2113 are implemented by analog circuits and function in an analog continuous way. Consequently, in these embodiments, along with the gradual transit of the operation region and the output resistance of the driving transistor Md the power rejection signal SPR is correspondingly and adaptively adjusted in an analog continuous way. one benefit and the advantage of such an arrangement is that an undesirable noise which might be generated due to a transit between different operation regions can be effectively avoided. In other words, in these embodiments, when the noise selection circuit 211 detects and determines that the driving transistor Md transits farther from the linear region, the noise selection circuit 211 will accordingly lower down the operation noise signal SON in an analog continuous way.

Also note that, in the above-mentioned embodiments (such as FIG. 4) of the present invention, because the unilateral control circuit is implemented to include a current amplification structure by using current amplifier circuits, the present invention can achieve the efficacy of lower power consumption, while in the meantime higher bandwidth (e.g. 100 KHz-1 MHz) in rejecting the power noise. Moreover, according to the circuit configurations as disclosed and proposed in the present invention, preferably, because it is not necessary for the present invention to control the driving transistor Md by a current mirror structure, the drawback that the rising and falling of the driving signal are asymmetrical to each other can be avoided. Furthermore, through adopting the current-type unilateral control circuit (i.e., unilateral control circuits 212, 213 and 214), it is possible for the present invention to inject the feed-forward compensation signal Sz in combination with several different types of power rejection signals SPR to the driving control node ND, while in the meantime the feed-forward compensation signal Sz and the several different types of power rejection signals SPR do not interfere each other. Moreover, because the present invention can generate the feed-forward compensation signal Sz by the current-type unilateral control circuit 214, it is possible for the LDO (e.g., the signal amplifier circuit 1000 as shown in FIG. 6) to effectively perform compensation for loop stability, without relying on the equivalent series resistance (ESR) of the output capacitor.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A signal amplifier circuit, comprising:
   a pre-amplifier circuit, which is configured to operably generate a driving signal at a driving control node; and
   a driver circuit, which is configured to operably convert an input power to an output power, wherein the driver circuit includes:
   a driving transistor having a first terminal coupled to the input power, a second terminal coupled to the output power, and a control terminal coupled to the driving signal, wherein a voltage difference between the first terminal of the driving transistor and the control terminal of the driving transistor determines a conduction level of the driving transistor, so as to convert the input power to the output power; and
   a power rejection circuit, which is configured to operably generate a power rejection signal at the driving control node according to the input power, to reject an AC component of a power noise of the input power so as to increase the power supply rejection ratio, wherein the power rejection signal has an AC component; wherein the power rejection circuit includes:
      a noise selection circuit, which is configured to operably detect and determine whether the driving transistor operates in a first operation region; wherein when the driving transistor operates in the first operation region, the noise selection circuit senses the AC component of the power noise of the input power according to a voltage difference between the first terminal and the second terminal, so as to generate an operation noise signal;
   wherein the power rejection circuit is configured to operably generate the power rejection signal at the driving control node according to the operation noise signal;
   wherein within the first operation region, an output resistance of the driving transistor is smaller than a predetermined resistance threshold.

2. The signal amplifier circuit of claim 1, wherein the power rejection circuit further includes at least one unilateral control circuit, wherein each unilateral control circuit has a corresponding input terminal and a corresponding output terminal; wherein the at least one unilateral control circuit includes a first unilateral control circuit, wherein an input terminal of the first unilateral control circuit is coupled to the noise selection circuit, and an output terminal of the first unilateral control circuit is coupled to the driving control node, wherein the first unilateral control circuit is configured to operably receive an AC component of the operation noise signal, to generate the power rejection signal at the driving control node; and wherein the first unilateral control circuit unilaterally injects the power rejection signal into the driving control node.

3. The signal amplifier circuit of claim 2, wherein the at least one unilateral control circuit further includes a second unilateral control circuit, wherein an input terminal of the second unilateral control circuit is electrically connected to the input power, and an output terminal of the second unilateral control circuit is coupled to the driving control node, wherein the second unilateral control circuit is configured to operably receive the AC component of the power noise, to generate the power rejection signal; and wherein the second unilateral control circuit unilaterally injects the power rejection signal into the driving control node.

4. The signal amplifier circuit of claim 3, wherein the pre-amplifier circuit includes a first gain stage circuit and a second gain stage circuit, wherein the second gain stage circuit is configured to operably generate the driving signal according to an output signal of the first gain stage circuit; and
   wherein the at least one unilateral control circuit further includes a third unilateral control circuit, wherein an input terminal of the third unilateral control circuit is electrically connected to the output signal of the first gain stage circuit, and an output terminal of the third unilateral control circuit is coupled to the driving control node, wherein the third unilateral control circuit is configured to operably receive the AC component of the output signal of the first gain stage circuit, to generate a feed-forward compensation signal; and wherein the third unilateral control circuit unilaterally injects the feed-forward compensation signal into the driving control node, thereby performing signal compensation on the signal amplifier circuit.

5. The signal amplifier circuit of claim 1, wherein the noise selection circuit includes:
a sensing transistor having a first terminal, a second terminal and a control terminal, wherein the sensing transistor is of a same type as the driving transistor, wherein the first terminal of the sensing transistor is coupled to the input power, and the control terminal of the sensing transistor is configured to operably receive the driving signal;
a reference transistor having a first terminal, a second terminal and a control terminal, wherein the reference transistor is of a same type as the driving transistor, wherein the first terminal of the reference transistor is coupled to the input power, and the control terminal of the reference transistor is configured to operably receive the driving signal;
a first current control circuit, which is configured to operably regulate a voltage of the second terminal of the sensing transistor according to a voltage of the second terminal of the driving transistor, such that the sensing transistor and the driving transistor concurrently operate in the first operation region or concurrently operate a second operation region, whereby a conduction current of the sensing transistor is positively proportional to a conduction current of the driving transistor;
a second current control circuit, which is configured to operably regulate a voltage of the second terminal of the reference transistor according to a reference voltage, such that the reference transistor operates in the second operation region; wherein when the driving transistor operates in the second operation region, the output resistance of the driving transistor is equal to or greater than the predetermined resistance threshold; and
a differential current amplifier circuit, which is configured to operably generate the operation noise signal according to a difference between the conduction current of the sensing transistor and the conduction current of the reference transistor.

6. The signal amplifier circuit of claim 5, wherein the driving transistor is a metal-oxide-semiconductor (MOS) transistor, wherein the first operation region corresponds to an linear region of the MOS transistor, while the second operation region corresponds to a saturation region of the MOS transistor.

7. The signal amplifier circuit of claim 2, wherein each unilateral control circuit includes:
an input capacitor, wherein a first terminal of the input capacitor is coupled to the input terminal of the unilateral control circuit;
an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage; and
an output capacitor, wherein a first terminal of the output capacitor is coupled to the second terminal of the current amplification transistor, and a second terminal of the output capacitor is coupled to the output terminal of the unilateral control circuit.

8. The signal amplifier circuit of claim 4, wherein each unilateral control circuit includes:
an input capacitor, wherein a first terminal of the input capacitor is coupled to the input terminal of the unilateral control circuit;
an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage; and
an output capacitor, wherein a first terminal of the output capacitor is coupled to the second terminal of the current amplification transistor, and a second terminal of the output capacitor is coupled to the output terminal of the unilateral control circuit; and
wherein the first unilateral control circuit, the second unilateral control circuit and the third unilateral control circuit share the same output capacitor.

9. The signal amplifier circuit of claim 1, further comprising a buffer circuit coupled between the driving signal and the control terminal of the driving transistor, wherein the buffer circuit is configured to operably generate a buffer driving signal according to the driving signal, to control the driving transistor.

10. The signal amplifier circuit of claim 5, wherein the first current control circuit includes:
a first mirror transistor which is connected as a diode;
a second mirror transistor coupled to the first mirror transistor as a mirror current source, wherein the second mirror transistor is configured to operably mirror a conduction current of the first mirror transistor to generate a conduction current of the second mirror transistor, wherein a source of the first mirror transistor and a source of the second mirror transistor are coupled to the second terminal of the sensing transistor and the second terminal of the driving transistor, respectively; and
a first amplification transistor coupled to the first mirror transistor and the second mirror transistor, wherein the first amplification transistor is configured to operably perform feedback amplification to generate a sensing current;
wherein the second current control circuit includes:
a third mirror transistor which is connected as a diode;
a fourth mirror transistor coupled to the third mirror transistor as a mirror current source, wherein the fourth mirror transistor is configured to operably mirror a conduction current of the third mirror transistor to generate a conduction current of the fourth mirror transistor, wherein a source of the third mirror transistor and a source of the fourth mirror transistor are coupled to the second terminal of the reference transistor and the reference voltage, respectively; and
a second amplification transistor coupled to the third mirror transistor and the fourth mirror transistor, wherein the second amplification transistor is configured to operably perform feedback amplification to generate a reference saturation current;
wherein the differential current amplifier circuit is configured to operably generate the operation noise signal according to a difference between the sensing current and the reference saturation current.

11. A signal amplifier circuit, comprising:
a pre-amplifier circuit, which is configured to operably generate a driving signal at a driving control node; and
a driver circuit, which is configured to operably convert an input power to an output power, wherein the driver circuit includes:
a driving transistor having a first terminal coupled to the input power, a second terminal coupled to the output power, and a control terminal coupled to the driving signal, wherein a voltage difference between the first terminal and the control terminal determines a conduction level of the driving transistor, so as to convert the input power to the output power; and
a power rejection circuit, which is configured to operably generate a power rejection signal at the driving control node according to the input power, to reject an AC component of a power noise of the input power, so as to increase a power supply rejection ratio, wherein the power rejection signal has an AC component; wherein the power rejection circuit includes:
an unilateral control circuit having an input terminal and an output terminal, wherein an input terminal of the unilateral control circuit is electrically connected to the input power, and an output terminal of the unilateral control circuit is coupled to the driving control node, wherein the unilateral control circuit is configured to operably receive the AC component of the power noise of the input power, to generate the power rejection signal; and wherein the unilateral control circuit unilaterally injects the power rejection signal into the driving control node.

12. The signal amplifier circuit of claim 11, wherein the unilateral control circuit includes:
an input capacitor, wherein a first terminal of the input capacitor is coupled to the input terminal of the unilateral control circuit;
an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage;
wherein a voltage difference between the first terminal of the current amplification transistor and the control terminal of the current amplification transistor determines a conduction level of the current amplification transistor; and
an output capacitor, wherein a first terminal of the output capacitor is coupled to the second terminal of the current amplification transistor, and a second terminal of the output capacitor is coupled to the output terminal of the unilateral control circuit.

13. A driver circuit, which is configured to operably receive a driving signal at a driving control node, to convert an input power to an output power; the driver circuit comprising:
a driving transistor having a first terminal coupled to the input power, a second terminal coupled to the output power, and a control terminal coupled to the driving signal, wherein a voltage difference between the first terminal of the driving transistor and the control terminal of the driving transistor determines a conduction level of the driving transistor, so as to convert the input power to the output power; and
a power rejection circuit, which is configured to operably generate a power rejection signal at the driving control node according to the input power, to reject an AC component of a power noise of the input power, so as to increase a power supply rejection ratio, wherein the power rejection signal has an AC component; wherein the power rejection circuit includes:
a noise selection circuit, which is configured to operably detect and determine whether the driving transistor operates in a first operation region; wherein when the driving transistor operates in the first operation region, the noise selection circuit senses the AC component according to a voltage difference between the first terminal and the second terminal, so as to generate an operation noise signal;
wherein the power rejection circuit is configured to operably generate the power rejection signal at the driving control node according to the operation noise signal;
wherein within the first operation region, an output resistance of the driving transistor is smaller than a predetermined resistance threshold.

14. The driver circuit of claim 13, wherein the power rejection circuit further includes: at least one unilateral control circuit; wherein each unilateral control circuit has a corresponding input terminal and a corresponding output terminal; wherein the at least one unilateral control circuit includes a first unilateral control circuit, wherein an input terminal of the first unilateral control circuit is coupled to the noise selection circuit, and an output terminal of the first unilateral control circuit is coupled to the driving control node, wherein the first unilateral control circuit is configured to operably receive an AC component of the operation noise signal, to generate the power rejection signal at the driving control node; and wherein the first unilateral control circuit unilaterally injects the power rejection signal into the driving control node.

15. The driver circuit of claim 14, wherein the at least one unilateral control circuit further includes a second unilateral control circuit, wherein an input terminal of the second unilateral control circuit is electrically connected to the input power, and an output terminal of the second unilateral control circuit is coupled to the driving control node, wherein the second unilateral control circuit is configured to operably receive the AC component of the power noise, to generate the power rejection signal; and wherein the second unilateral control circuit unilaterally injects the power rejection signal into the driving control node.

16. The driver circuit of claim 13, wherein the noise selection circuit includes:
a sensing transistor having a first terminal, a second terminal and a control terminal, wherein the sensing transistor is of a same type as the driving transistor, wherein the first terminal of the sensing transistor is coupled to the input power, and the control terminal of the sensing transistor is configured to operably receive the driving signal;
a reference transistor having a first terminal, a second terminal and a control terminal, wherein the reference transistor is of a same type as the driving transistor, wherein the first terminal of the reference transistor is coupled to the input power, and the control terminal of the reference transistor is configured to operably receive the driving signal;

a first current control circuit, which is configured to operably regulate a voltage of the second terminal of the sensing transistor according to a voltage of the second terminal of the driving transistor, such that the sensing transistor and the driving transistor concurrently operate in the first operation region or concurrently operate a second operation region, whereby a conduction current of the sensing transistor is positively proportional to a conduction current of the driving transistor;

a second current control circuit, which is configured to operably regulate a voltage of the second terminal of the reference transistor according to a reference voltage, such that the reference transistor operates in the second operation region; wherein when the driving transistor operates in the second operation region, the output resistance of the driving transistor is equal to or greater than the predetermined resistance threshold; and a differential current amplifier circuit, which is configured to operably generate the operation noise signal according to a difference between the conduction current of the sensing transistor and the conduction current of the reference transistor.

17. The driver circuit of claim 14, wherein each unilateral control circuit includes:

an input capacitor, wherein a first terminal of the input capacitor is coupled to the input terminal of the unilateral control circuit;

an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage; and an output capacitor, wherein a first terminal of the output capacitor is coupled to the second terminal of the current amplification transistor, and a second terminal of the output capacitor is coupled to the output terminal of the unilateral control circuit.

18. The driver circuit of claim 15, wherein each of the unilateral control circuits includes:

an input capacitor, wherein a first terminal of the input capacitor is coupled to the input terminal of the unilateral control circuit;

an unilateral current amplifier circuit including a current amplification transistor, wherein the current amplification transistor has a first terminal, a second terminal and a control terminal, wherein the first terminal of the current amplification transistor is coupled to a second terminal of the input capacitor, and the control terminal of the current amplification transistor is coupled to a bias voltage; and an output capacitor, wherein a first terminal of the output capacitor is coupled to the second terminal of the current amplification transistor, and a second terminal of the output capacitor is coupled to the output terminal of the unilateral control circuit.

* * * * *